United States Patent [19]
Goodman et al.

[11] Patent Number: 5,427,817
[45] Date of Patent: Jun. 27, 1995

[54] PROCESS FOR MANUFACTURING AN AUTO-COLLIMATING SCINTILLATOR AND PRODUCT PRODUCED THEREBY

[75] Inventors: Claude A. Goodman, El Cerrito; Alan F. Lyon; Victor Perez-Mendez, both of Berkeley, all of Calif.

[73] Assignee: University of California, Berkeley, Calif.

[21] Appl. No.: 148,193

[22] Filed: Nov. 2, 1993

[51] Int. Cl.6 .............................................. B05D 5/06
[52] U.S. Cl. .................................... 427/65; 427/69; 427/157; 427/240; 427/250; 427/255; 427/255.5; 427/294
[58] Field of Search ................ 427/64, 240, 250, 294, 427/65, 70, 255.5, 157, 255

[56] References Cited
U.S. PATENT DOCUMENTS

| | | | |
|---|---|---|---|
| 4,069,355 | 1/1978 | Lubowski et al. | 427/70 |
| 4,528,210 | 7/1985 | Noji et al. | 427/69 |
| 5,185,181 | 2/1993 | Mikami et al. | 427/69 |
| 5,298,294 | 3/1994 | Vieux et al. | 427/69 |

*Primary Examiner*—Janyce Bell
*Attorney, Agent, or Firm*—Louis E. Marn

[57] ABSTRACT

There is described a process for the vapor deposition of a scintillator phosphor composition with concomitant shadowing wherein the substrate to be processed is rotated through an arc relative to a vapor source of the scintillator phosphor composition whereby shadowing introduces voided gaps or interstices between columns as a result of the preferential components receiving more coating flux, particularly in the presence of oblique flux.

12 Claims, 6 Drawing Sheets

PROCESS FOR MANUFACTURING AN AUTO-COLLIMATING SCINTILLATOR AND PRODUCT PRODUCED THEREBY

The invention described herewith was made with Government support under Contract No. DE-AC03-76SF00098 between the Department of Energy and the University of California.

BACKGROUND OF THE INVENTION

1. Field of the Invention

The present invention relates to radiation imaging technology, and more particularly to a method of manufacturing a structured, auto-collimating scintillator.

2. Brief Description of the Prior Art

In U.S. Pat. No. 4,069,355 to Lubowski et al, there is described a process for forming a patterned substrate using wide-angled vapor deposition techniques so as to deposit a phosphor on the raised portion of the substrate, including the steps of vapor deposition of a phosphor, such as cesium iodide.

In U.S. Pat. No. 4,842,894 to Ligtenberg et al, there is disclosed a process for vapor deposition of a luminescent layer on a screen substrate wherein the vapor deposition crucible is rotated about an axis perpendicular to the screen.

In conventional thin film deposition techniques involves the changing of the surface properties of substrate materials to impart advantageous characteristics, e.g., a corrosion-resistant coating, etc., successful surface modification depends on the deposition of a continuous, defect-free coating layer. Conversely, an effective auto-collimating screen layer must be replete with uniform structural discontinuities.

In this connection, for example, reference is made to U.S. Pat. No. 5,171,996 to Perez-Mendez wherein there is described a method for fabricating a particle detector of a sequence of columns of regular, controllable geometry and diameter perpendicular to the interface of luminescent material with adjacent materials wherein the columns are separated by gaps which may be evacuated or filled with air with a light-absorbing material or with a light-producing or light-reflective substance. While the processes of the prior art have achieved certain levels of performance, there is a desire to optimize a performance of a structured, auto-collimating scintillator to achieve high ionizing radiation to luminescent conversion efficiency as well as high spacial resolution.

OBJECTS OF THE PRESENT INVENTION

An object of the present invention is to provide a process for forming a structured, auto-collimating scintillator of high ionizing radiation to luminescent conversion efficiency with concomitant high spacial resolution.

A still further object of the present invention is to provide a method for depositing a structured screen layer of uniformed crystal columns and interstices of controllable geometry to optically decouple the luminescent columns while retaining a high fill factor.

A still further object of the present invention is to provide a simple, more economical method for producing a structured, auto-collimating scintillator of enhanced detector spacial resolution and efficiency.

Still another object of the present invention is to provide a method of depositing a scintillator layer directly upon delicate photodetector layer such as charge coupled devices, photodiode arrays and the like while maintaining integrity of the photodetector layer.

SUMMARY OF THE PRESENT INVENTION

These and other objects of the present invention are achieved by vapor deposition scintillator of a phosphor composition on a substrate with concomitant shadowing wherein the substrate to be processed is rotated through an arc relative to a vapor source of the scintillator phosphor composition whereby shadowing introduces voided gaps or interstices between columns as a result of the preferential components receiving more coating flux, particularly in the presence of oblique flux.

BRIEF DESCRIPTION OF THE DRAWINGS

Other features and advantages of the present invention will become more readily apparent from the following detailed description when taken with the accompanying drawings wherein.

DETAILED DESCRIPTION OF THE INVENTION

Figure 1:
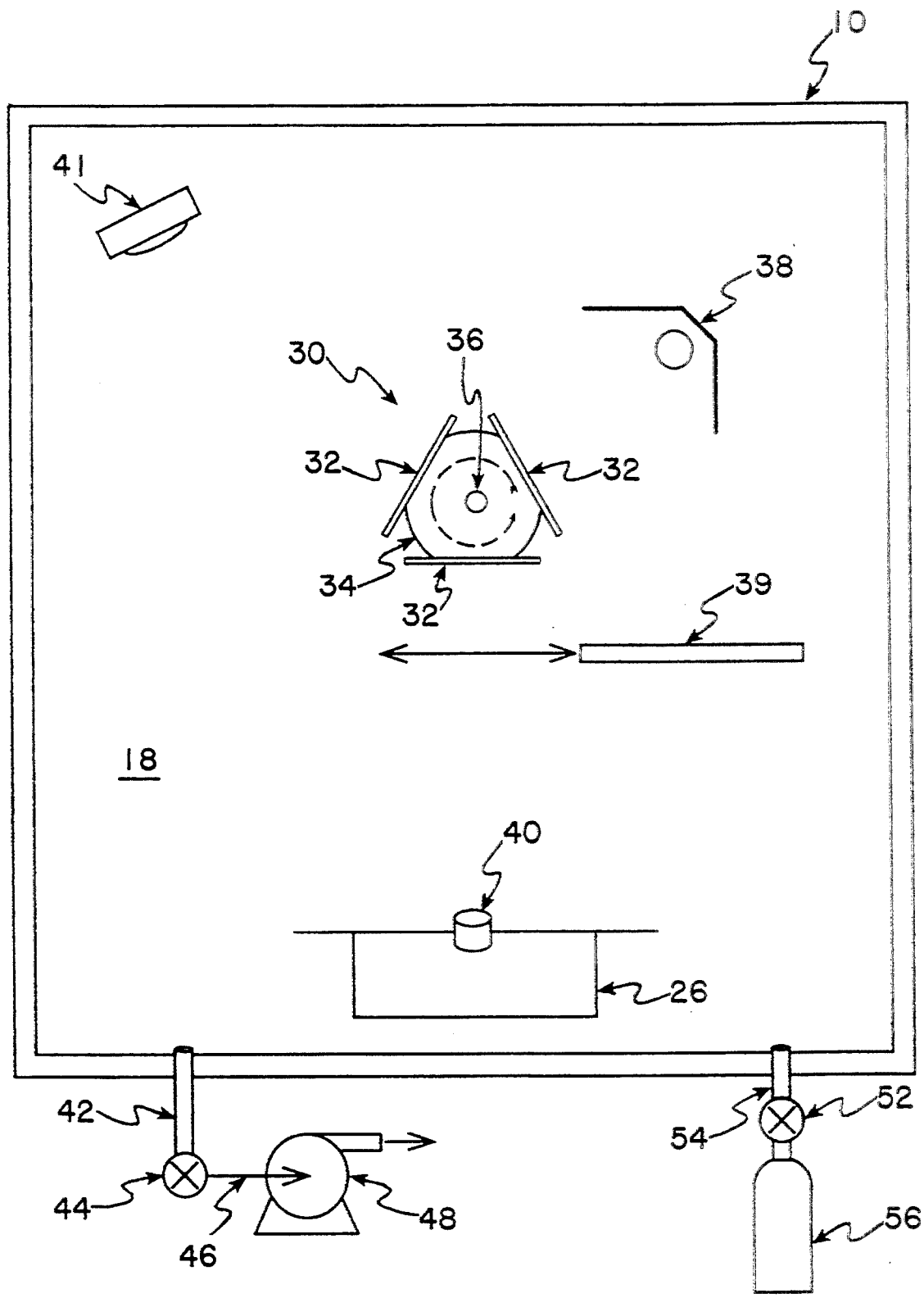
FIG. 1 is a schematic elevational sectional view of the vapor deposition apparatus of the present invention.
Figure 2:
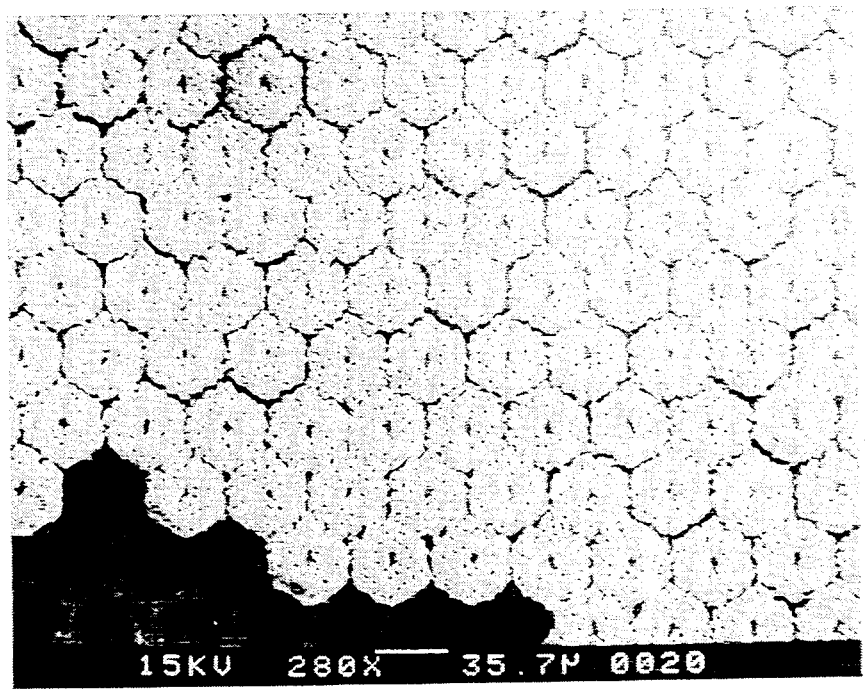
FIG. 2 illustrates the structure due to preferential deposition and shadowing effected by the process of the present invention.
Figure 3:
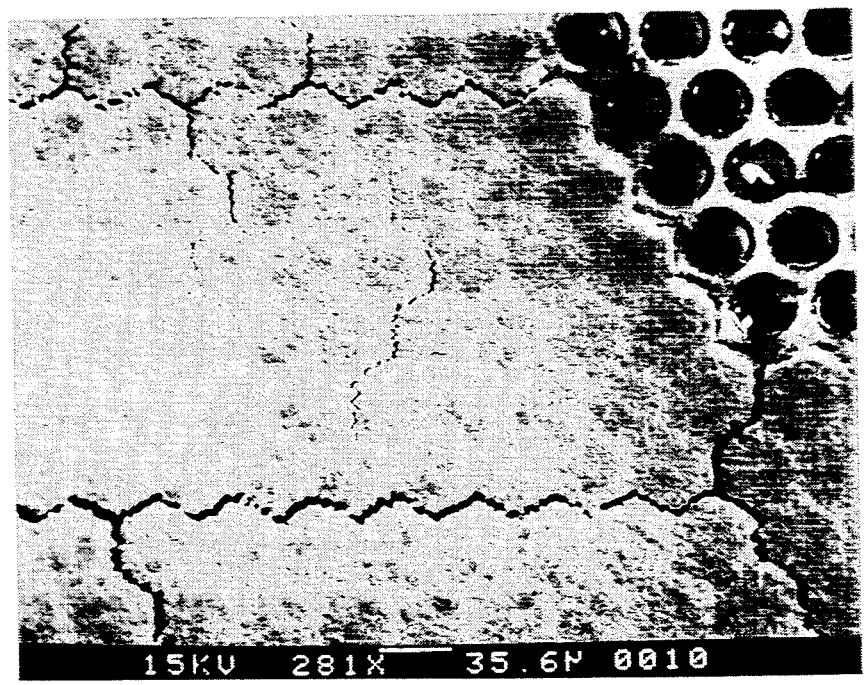
FIG. 3 illustrates the structure due to thermal mismatch stress cracking.
Figure 4:
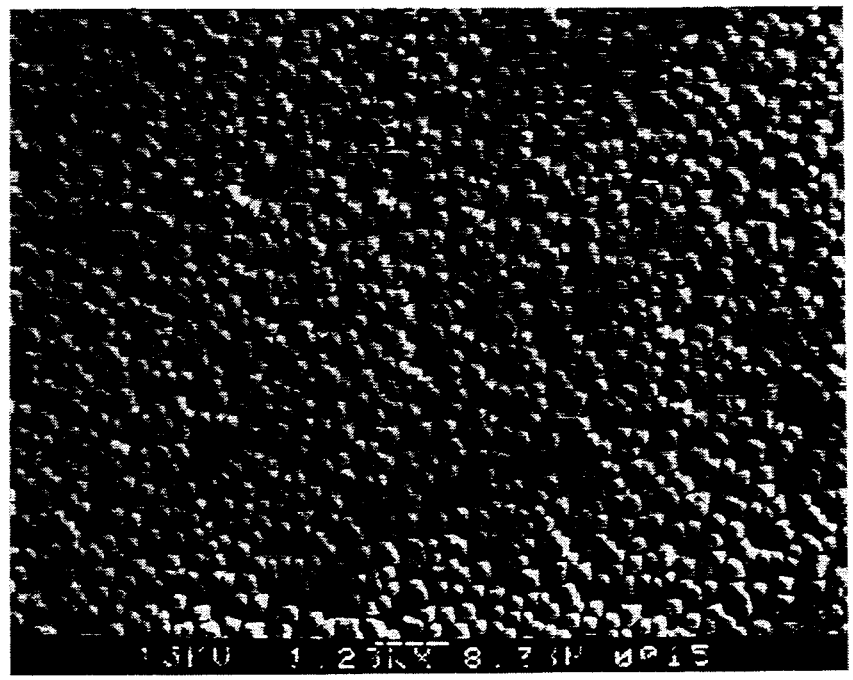
FIG. 4 is a electromicrograph of cesium iodide (T1) scintillator deposition by rotation of smooth substrate at 5 mTorr Argon.
Figure 5:
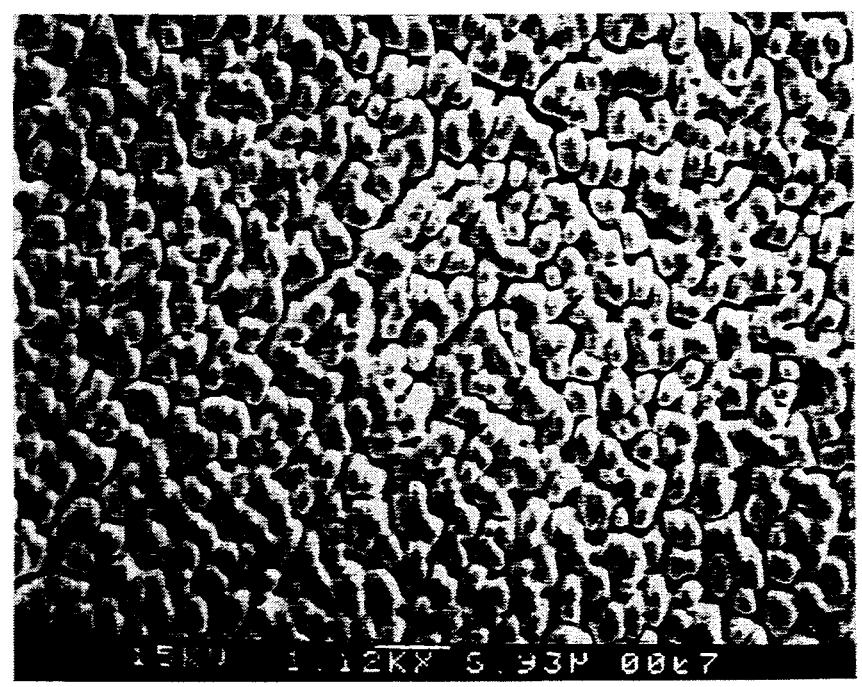
FIG. 5 is a scanning electromicrograph of a CsI(T1) scintillator deposit by rotation on a smooth substrate at 1 $\mu$Torr vacuum.
Figure 6:
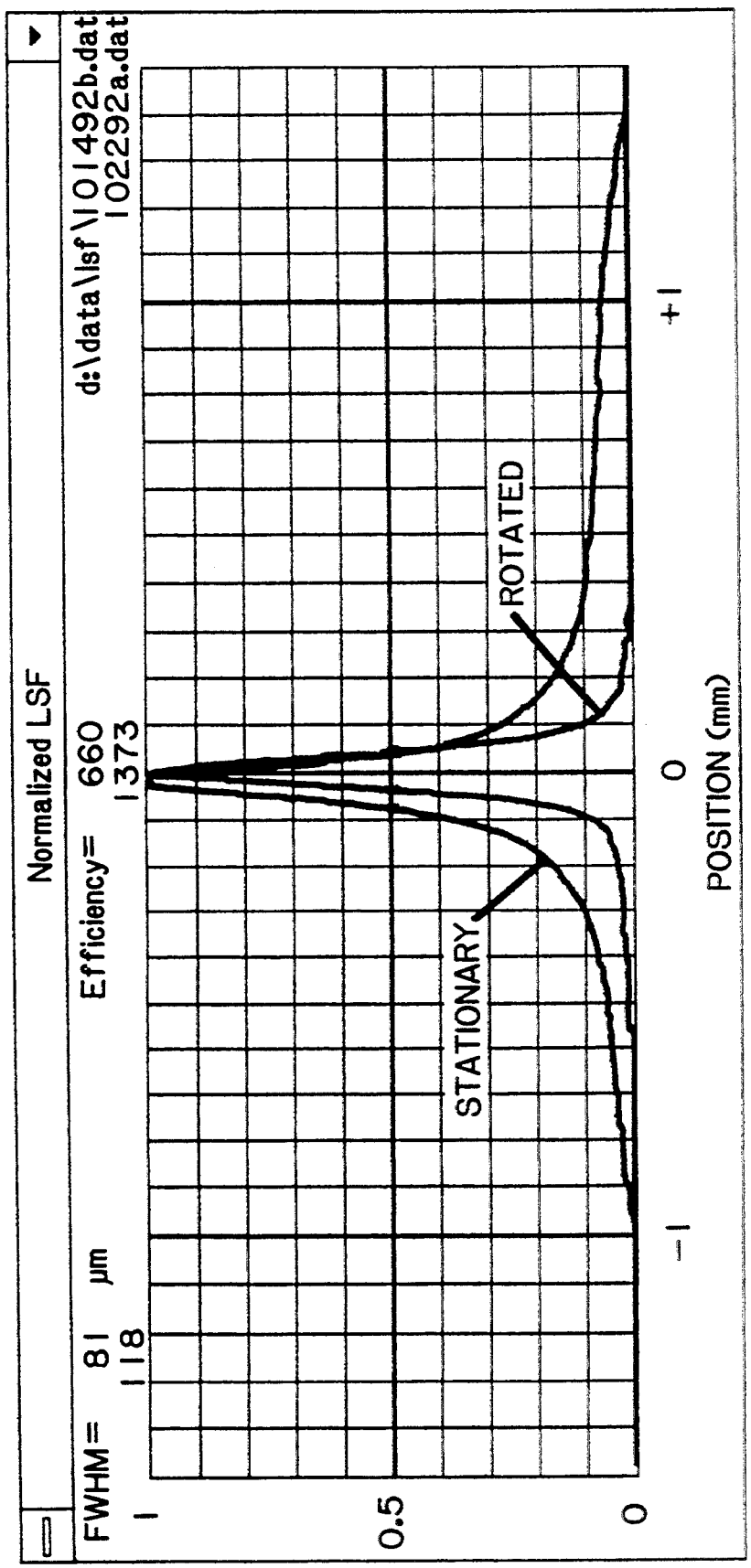
FIG. 6 is a graph depicting the optical characteristics of rotated and stationary samples of FIGS. 2 and 3 illustrating line spread function—an indication of image blur.
Figure 7:
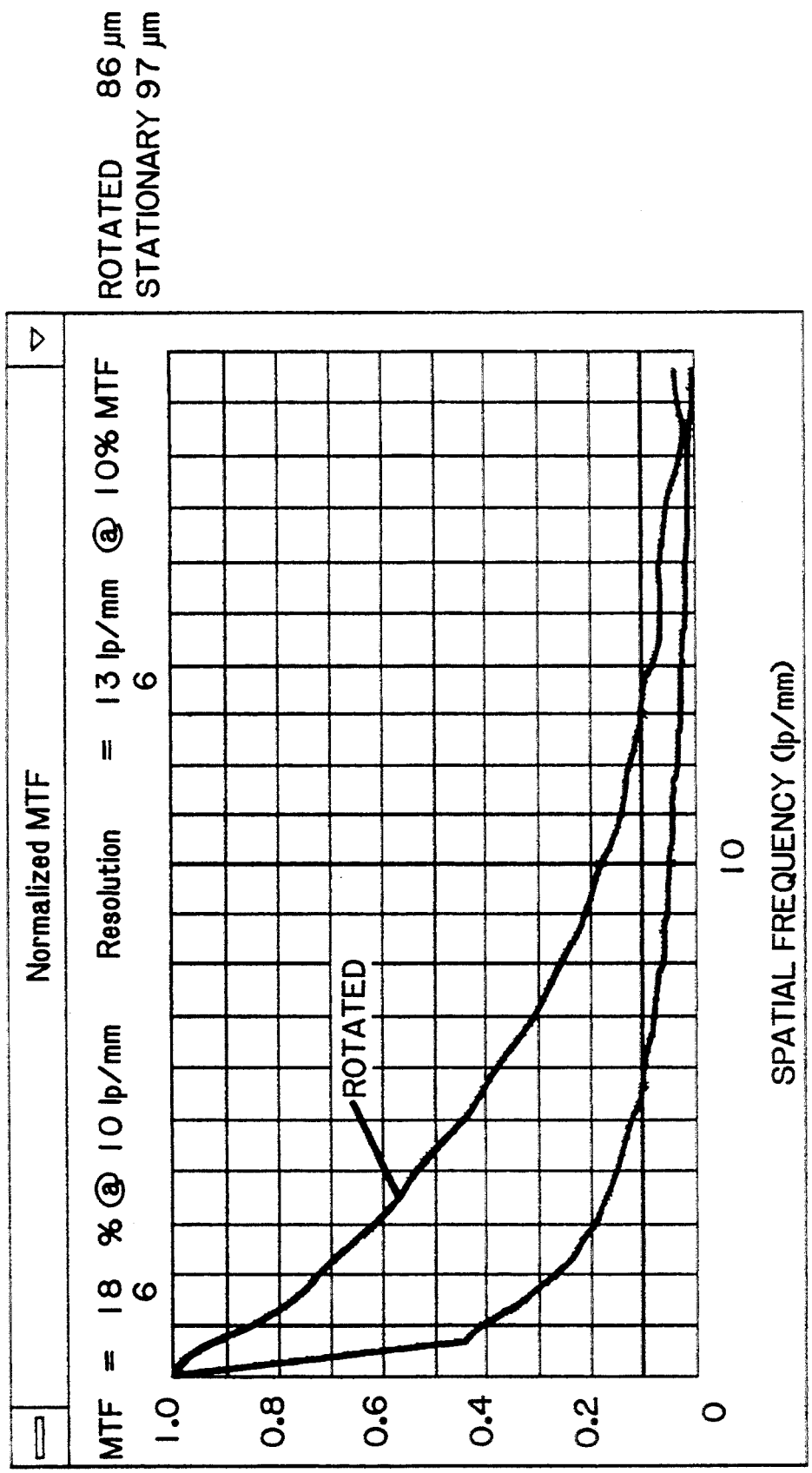
FIG. 7 is a graph of modulation transfer function illustrating optical characteristics of the structure of FIGS. 2 and 3 including spacial resolution.

Referring now to FIG. 1, there is illustrated a vacuum evaporator, generally indicated as 10 comprised of inner sidewall members 12, bottom wall member 14 and top wall member 16 defining interior chamber 18. The inner sidewall member 12, the bottom wall 14 and top wall 16 are insulated by outer sidewalls 20, bottom wall 22 and top wall 24, respectively, as known to one skilled in the art. Disposed in the chamber 18 proximate the inner bottom wall 14, there is provided a conventional "boat" assembly 26 for receiving a phosphor material to be deposited on a substrate, as more clearly hereinafter described. The boat 26 is heated by any convenient means, such as a schematically-illustrated heating coil 28.

Disposed within the chamber 18 and directly above the boat 26, there is provided a rotating mandrel assembly, generally indicated as 30, for positioning a plurality of substrates 32 to be coated with a phosphor. The mandrel assembly 30 includes a mandrel 34 suitably disposed on a shaft member 36 for rotation thereon and driven by a motor assembly (not shown). A radiant heater 38 and a mandrel cooler (not shown) permits precise temperature control of the substrates 32. Positioned below the rotating mandrel assembly 30, there is disposed a shutter member 39 for selective positioning between the rotating mandrel assembly 30 and the boat assembly 26 as more clearly hereinafter discussed. Positioned above the rotating mandrel assembly 30 and angularly disposed with reference to a chimney 40 of the boat assembly 26, there is provided a rate monitor, generally indicated as 41. Extending into the chamber 18, there is provided a conduit 42 under the control of valve 44 in fluid communication by line 46 with the suction side of a vacuum pump 48. Also extending into the chamber 18 is a conduit 54 under the control of valve 52 in fluid communication with a tank 56 of an inert gas, such as argon and the like.

The substrates to be coated in accordance with the present invention include a base layer glass, plastic, a ceramic material, a thin metal layer of aluminum, titanium or the like, or crystalline or amorphous silica or ammonium selectively overlaid with a layer of a photodiode material followed by a layer of a transparent electrically-conductive material. The photodiode material include hydrogenated amorphous column IV semiconductor material, such as a Si:H or a Ge:H. Transparent electrically-conductive materials include indium tin oxide compositions, tin oxide or like suitable thin metal films whereby the conductive layer is of at least partially optically transparent and allows passage of electromagnetic radiation of appropriate wavelengths between a luminescent layer to be formed on the transparent electrically-conductive material and the photodiode layer as understood by one skilled in the art.

The scintillator phosphors materials to be deposited by vapor deposition techniques include metal or rare earth activated compositions, such as cesium iodide (CsI(T1)), potassium iodide (KI), rubidium iodide (RbI), (gallum selenide (Ga,Se), gadolinum oxy sulphate ($Gd_2O_2S$), lanthanum oxysulphate ($La_2O_2S$), cadmium sulphide (CdS), zinc cadmium sulphide ($Zn_xCd_{1-x}S$)) and the like capable of receiving incident charged particles or photons of high energy to one or a plurality of photons of individual energies lying in the range of $1-4_eV$.

In operation, one or more preformed substrates 32 to be coated are positioned on the mandrel 34 of the rotating mandrel assembly and the evaporator boat 40 is supplied with a phosphor material, such as thallium activated cesium iodide to be deposited thereon. The vacuum pump member 48 is activated to provide a vacuum within the chamber 1 of from about 1 to 10 $\mu$Torr. The evaporator boat 40 is heated to a temperature sufficient to sublime or vaporize the phosphor material. During heating, the shutter member 39 is positioned between the mandrel assembly 30 and the evaporator boat 40. Upon reaching operational temperatures, for example, of from 550° to 750° C. (for CsI(T1)), the shutter member 39 is caused to be withdrawn. Vapor deposition is effected at a rate of from about 1 to 10 microns per minute as measured by the rate meter 41. The mandrel assembly 30 is rotated at a rotational speed of from about 10 to 100 RPM'S. Thus, a substrate 32 is rotated about an axis perpendicular to the source of phosphor vapor. Vapor deposition is continued for a period of time sufficient to form a layer of phosphors of a thickness of about 50 to 500 microns thereby forming structured, auto-collimating crystalline column and interstices.

In accordance with the present invention, the essential oblique flux is produced by rotating the substrate 32 through an arc relative to the vapor source thereby propagating crystallite structures on the substrate surface which manifest and grow most efficiently for a given set of deposition parameters, overshadowing and outgrowing to form discrete crystalline filaments as illustrated in Figures.

With the use of a two component scintillator phosphor compound such as the thallium activated cesium iodide, special care must be taken to assure that separation of the constituents does not occur during the evaporation process since a thallium depleted layer will have its efficiency reduced to $\frac{1}{3}$ of that of an optimally activated layer. Consequently, enhance deposition of one component of a two component scintillator phosphor material must be avoided and is avoided by suitable modifying the conditions of vapor deposition to accommodate a continuous, precisely metered material feed. It will be understood by one skilled in the art that techniques, such as flash and ingot feed evaporation, or alternately a rate-controlled dual evaporator system may be used to maintain correct component portions in the vapor deposited layer.

Figure 8:
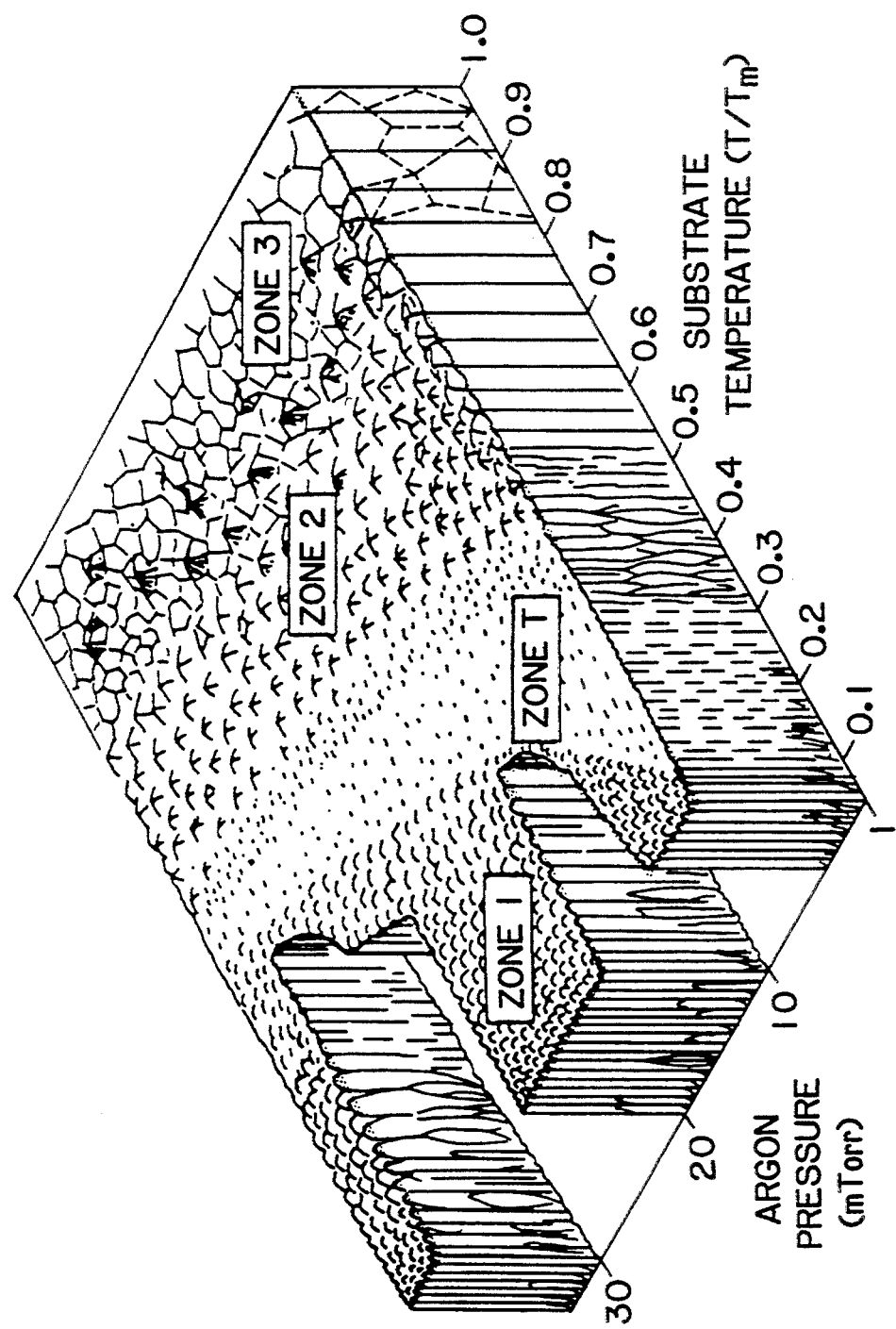
FIG. 8 is a Morchan-Demchiskin diagram.

As understood by one skilled in the art, the crystalline microstructure of the thus formed scintillator phosphor layer is a function of the deposition temperature and rate as illustrated by the MORCHAN-DEMCHISKIN diagram of FIG. 8 depicting structural zones in vacuum condensates as a function of the ratio of the absolute deposition temperature (T) to the melting point (Tm) of the component system for a two component system, such as the thallium activated cesium iodide system, as hereinabove described. For such systems, reliable ratios of T/Tm between 0.3 and 0.6 place the deposited structure in the transition zone, Zone T between Zone 1 (flared columns separated by voided boundaries) and Zone 2 (columnar grains with dense inter crystalline boundaries). Flaring, which increases with temperature, causes discrete columns to coalesce and thus flaring is minimized by maintaining the substrate temperature constant for the duration of vapor deposition, or alternately by descreening substrate temperature during vapor deposition.

Inert gases, such as Argon, may be present at a pressure of from 1 to 100 mTorr, preferably 10 mTorr permitting Zone 1 structures for T/Tm ratios in the range of from 0.3 equal to or less than T/Tm equal to or less than 0.6. The presence of an inert gas, such as Argon, facilitates substrate surface preparation. A glow discharge electrode (not shown) may be provided proximate the substrate surface during substrate surface preparation to effect in-situ sputter cleaning prior to vapor deposition. In accordance with the present invention, as a function of processing conditions, auto-collimating scintillator layers have been fabricated with tenpercent modulation transfer functions (MTF) exceeding twenty lines pairs per millimeter resolution.

The process of the present invention is set forth in the following specific example which is intended to be merely illustrative and the present invention is intended not to be limited thereto.

EXAMPLE

A CsI(T1) layer with resolution exceeding 10 line pairs per millimeter at ten percent MTF is desired. Calculations show that a vapor deposited layer of about 120 microns thick is required with a concentration of 0.2 mole percent thallium doping for maximum conversion efficiency. A deposition rate of about 2 microns per minute, rotation rate of about 60 RPM'S and Argon pressure of 6 mTorr are desired to fabricate an optimal scintillator layer. The vacuum chamber is pumped down to 1 uTorr, then back filled with Argon to 5 mTorr. The evaporation boat temperature and phosphor feed rate are adjusted such that the rate monitor registers a deposition rate equivalent to 2 microns per minute on the substrate surface. The shutter is opened for one hour to deposit a 120 micron thick layer. During the course of deposition, the substrate temperature is maintained at 100° C. during the deposition by the mandrel heating and cooling subsystems.

While the present invention has been described with reference to a preferred embodiment of the present invention wherein a substrate is rotated about an axis perpendicular to the source of phosphor vapor, it is understood that rotation is relative and that rotation may be effected about an axis other than perpendicular to the source of phosphor vapor.

While the present invention has been described in connection with an exemplary embodiment thereof, it will be understood that many modifications will be apparent to those of ordinary skill in the art; and that this application is intended to cover any adaptations or variations thereof. Therefore, it is manifestly intended that this invention be only limited by the claims and the equivalents thereof.

What is claimed:

1. A process for forming a scintillator screen using vapor deposition techniques, which comprises:
   a) positioning a scintillator screen substrate on a mandrel in a vapor deposition chamber;
   b) directing a source of a vapor of a phosphor material towards said scintillator screen substrate; and
   c) rotating said scintillator screen substrate with respect to said source of vapor during step b) for a time sufficient to form said scintillator screen.

2. The process for forming a scintillator screen as described in claim 1 wherein said phosphor material is selected from the group consisting of metal or rare earth activated phosphor compositions.

3. The process for forming a scintillator screen as described in claim 2 wherein said phosphor materials include thallium doped cesium iodide, potassium iodide, rubidium iodide, gallium selenide, gadolinium oxysulphate, lanthanum oxysulphate, cadmium sulfide, zinc cadmium sulfide.

4. The process for forming a scintillator screen as described in claim 3 wherein said phosphor material is thallium doped cesium iodide.

5. The process for forming a scintillator screen as described in claim 1 wherein rotation is effected between a plane of said substrate perpendicular to a major axis of said source of said vapor.

6. The process for forming a scintillator screen as described in claim 1 wherein rotation is at a rate of from 1 to 100 RPM'S.

7. The process for forming a scintillator screen as described in claim 1 wherein steps b) and c) are maintained to effect a layer deposition of phosphor material of between 50 to 500 microns.

8. The process for forming a scintillator screen as described in claim 1 wherein rate of vapor deposition is from about 1 to 10 microns per minute.

9. The process for forming a scintillator screen as described in claim 1 wherein a vacuum of from 1 $\mu$Torr to 100 mTorr is maintained during vapor deposition.

10. The process for forming a scintillator screen as described in claim 9 wherein said vacuum is preferably between 1 to 100 mTorr.

11. The process for forming a scintillator screen as described in claim 10 wherein said vacuum is 10 mTorr.

12. The process for forming a scintillator screen as described in claim 1 and further including the steps of effecting a glow discharge proximate said substrate.

* * * * *